United States Patent
Day

(10) Patent No.: US 10,389,312 B2
(45) Date of Patent: Aug. 20, 2019

(54) BIAS MODULATION ACTIVE LINEARIZATION FOR BROADBAND AMPLIFIERS

(71) Applicant: Analog Devices, Inc., Norwood, MA (US)

(72) Inventor: Christopher John Day, Santa Rosa, CA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 15/879,947

(22) Filed: Jan. 25, 2018

(65) Prior Publication Data

US 2018/0212573 A1 Jul. 26, 2018

Related U.S. Application Data

(60) Provisional application No. 62/450,670, filed on Jan. 26, 2017.

(51) Int. Cl.
*H03F 3/45* (2006.01)
*H03F 1/32* (2006.01)
(Continued)

(52) U.S. Cl.
CPC ......... *H03F 1/3211* (2013.01); *H03F 1/0266* (2013.01); *H03F 3/19* (2013.01);
(Continued)

(58) Field of Classification Search
CPC .... H03F 3/45; H03F 2200/06; H03F 2200/09; H03G 3/30
(Continued)

(56) References Cited

U.S. PATENT DOCUMENTS

| 4,638,260 A | 1/1987 | Hamley |
| 5,012,199 A | 4/1991 | McKale |

(Continued)

FOREIGN PATENT DOCUMENTS

| CN | 103326682 | 9/2013 |
| WO | 9945637 | 9/1999 |

(Continued)

OTHER PUBLICATIONS

"U.S. Appl. No. 15/457,431, 312 Amendment filed Oct. 22, 2018", 9 pgs.

(Continued)

*Primary Examiner* — Steven J Mottola
(74) *Attorney, Agent, or Firm* — Schwegman Lundberg & Woessner, P.A.

(57) ABSTRACT

A power amplifier circuit for broadband data communication over a path in a communication network can reduce or avoid gain compression, provide low distortion amplification performance, and can accommodate a wider input signal amplitude range. A dynamic variable bias current circuit can be coupled to a common emitter bias node of a differential pair of transistors to provide a dynamic variable bias current thereto as a function of an input signal amplitude of an input signal. Bias current is increased when input signal amplitude exceeds a threshold voltage established by an offset or level-shifting circuit. The frequency response of the bias current circuit can track the frequency content of the input signal. A delay in the signal path to the differential pair can phase-align the bias current to the amplification by the differential pair. A dynamic variable supply voltage can be based on an envelope of the input signal.

23 Claims, 16 Drawing Sheets

(51) Int. Cl.
  *H03F 3/19* (2006.01)
  *H04L 25/08* (2006.01)
  *H03F 1/02* (2006.01)

(52) U.S. Cl.
  CPC ..... *H03F 3/45085* (2013.01); *H03F 3/45179* (2013.01); *H04L 25/085* (2013.01); *H03F 2200/102* (2013.01); *H03F 2203/45112* (2013.01); *H03F 2203/45244* (2013.01); *H03F 2203/45392* (2013.01); *H03F 2203/45454* (2013.01)

(58) Field of Classification Search
  USPC .......................................... 330/136, 254, 301
  See application file for complete search history.

(56) References Cited

U.S. PATENT DOCUMENTS

| | | | |
|---|---|---|---|
| 5,216,379 | A | 6/1993 | Hamley |
| 5,477,188 | A | 12/1995 | Chawla |
| 5,559,469 | A | 9/1996 | Smith |
| 5,793,252 | A | 8/1998 | Smith |
| 5,880,632 | A | 3/1999 | Yamasita |
| 5,955,921 | A * | 9/1999 | Ide ................. H03G 3/3084 330/136 |
| 6,615,028 | B1 | 9/2003 | Loke et al. |
| 6,782,244 | B2 | 8/2004 | Steel et al. |
| 6,804,500 | B2 | 10/2004 | Yamaguchi |
| 7,091,788 | B2 | 8/2006 | Glass |
| 7,728,661 | B2 | 6/2010 | Bocjelman et al. |
| 7,768,350 | B2 | 8/2010 | Srinivasan et al. |
| 7,936,215 | B2 | 5/2011 | Lee et al. |
| 8,031,003 | B2 | 10/2011 | Dishop |
| 8,130,039 | B2 | 3/2012 | Dishop |
| 8,149,064 | B2 | 4/2012 | Paul et al. |
| 8,198,968 | B2 | 6/2012 | Oliaei et al. |
| 8,666,340 | B2 | 3/2014 | Rofougaran et al. |
| 8,718,580 | B2 | 5/2014 | Borodulin et al. |
| 10,177,717 | B2 | 1/2019 | Day et al. |
| 2006/0022748 | A1 | 2/2006 | Udagawa |
| 2008/0079496 | A1* | 4/2008 | Thompson .......... H03F 1/565 330/301 |
| 2012/0112835 | A1* | 5/2012 | Comeau ............. H03F 1/22 330/252 |
| 2013/0257537 | A1 | 10/2013 | Mourant et al. |
| 2014/0091814 | A1 | 4/2014 | Boucey et al. |
| 2016/0072460 | A1 | 3/2016 | Tatsumi |
| 2017/0264252 | A1 | 9/2017 | Day et al. |
| 2017/0324386 | A1* | 11/2017 | Schemmann .......... H03F 3/20 |

FOREIGN PATENT DOCUMENTS

| | | |
|---|---|---|
| WO | WO-2010045597 A1 | 4/2010 |
| WO | WO-2017160747 A1 | 9/2017 |
| WO | 2018140609 A1 | 8/2018 |

OTHER PUBLICATIONS

"U.S. Appl. No. 15/457,431, Response filed Apr. 30, 2018 to Non Final Office Action dated Dec. 29, 2017", 17 pgs.

"International Application Serial No. PCT US2018 015255, International Search Report dated May 13, 2018", 4 pgs.

"International Application Serial No. PCT US2018 015255, Written Opinion dated May 13, 2018", 4 pgs.

"U.S. Appl. No. 15/457,431, Notice of Allowance dated Jul. 20, 2018", 8 pgs.

"U.S. Appl. No. 15/457,431, Corrected Notice of Allowability dated Dec. 12, 2018", 2 pgs.

"U.S. Appl. No. 15/457,431, PTO Response to Rule 312 Communication dated Nov. 23, 2018", 2 pgs.

"U.S. Appl. No. 15/457,431, Non Final Office Action dated Dec. 29, 2017", 9 pgs.

"International Application Serial No. PCT/US2017/022145, International Search Report dated May 31, 2017", 4 pgs.

"International Application Serial No. PCT/US2017/022145, Written Opinion dated May 31, 2017", 7 pgs.

Meyer, Robert G., et al., "A 4-Terminal Wide-Band Monolithic Amplifier", IEEE Journal of Solid-State Circuits, vol. SC-16, No. 6, (Dec. 1981), 634-638.

Meyer, Robert G., et al., "A Wide-Band Ultralinear Amplifier from 3 to 300 MHz", IEEE Journal of Solid-State Circuits, vol. SC-9, No. 4, (Aug. 1974), 167-175.

Paidi, Vamsi, et al., "High Linearity and High Efficiency of Class-B Power Amplifiers in GaN HEMT Technology", IEEE Transactions on Microwave Theory and Techniques, vol. 51, No. 2, (Feb. 2003), 643-652.

Solomon, J. E., et al., "A Highly Desensitized, Wide-Band Monolithic Amplifier", IEEE Journal of Solid-State Circuits, vol. SC-1, No. 1., (Sep. 1966), 19-28.

Tanimoto, Hiroshi, et al., "Realization of a 1-V Active Filter Using a Linearization Technique Employing Plurality of Emitter-Coupled Pairs", IEEE Journal of Solid-State Circuits, vol. 26, No. 7, (Jul. 1991), 937-945.

* cited by examiner

BIAS MODULATION ACTIVE LINEARIZATION FOR BROADBAND AMPLIFIERS

CLAIM OF PRIORITY

This patent application claims the benefit of priority of Christopher John Day U.S. Provisional Patent Application Ser. No. 62/450,670, entitled "ACTIVE LINEARIZATION THROUGH BIAS MODULATION FOR BROADBAND AMPLIFIERS" filed on Jan. 26, 2017, which is hereby incorporated by reference herein in its entirety.

TECHNICAL FIELD

This document pertains generally, but not by way of limitation, to electrical communications systems and circuits, and more particularly, but not by way of limitation, to active linearization through bias modulation for broadband amplifiers.

BACKGROUND

As broadband communications systems emerge, the need for power efficient transmission is becoming increasingly important as communications network operators try to reduce capital and operating expenses. In the case of cable television systems, which rely on Class A transmission of signals, the cost of powering the network is the largest operating expense.

SUMMARY

The present inventor has recognized, among other things, that a more power efficient amplifier would be highly desirable for cable operators. At the same time consumers of broadband content, such as pay-per-view digital video and popular video streaming services like Netflix, demand increased levels of content available across multiple devices at any time. Hence the bandwidth demands on the network continue to grow. Forecasters see little change in the growth pattern of data consumption.

To meet this demand, one approach available to system operators is to turn to advanced methods of encoding their signals before transmission over their networks. These modulation techniques are increasingly sophisticated and can provide impressive leaps in bandwidth efficiency. Unfortunately, with this advance comes a drawback that the encoded signals can often be much harder to amplify. For example, these advanced encoded signals can have very high peak power excursions when compared to their average levels. This can wreak havoc on amplifiers throughout the system. At the same time, the complex nature of these advanced encoded signals demands a step-up in signal fidelity throughout the system. This, in turn, means that transmission system amplifiers may need reduced levels of distortion to achieve good performance. Without low levels of distortion in the system, customers can experience impairments like pixilation of their video streams or poor internet throughput performance. The need for low distortion in the system is now magnified with the deployment of such advanced encoded signals, as well as by the increased amount of signals placed on the network.

Since distortion performance is paramount, the Class A topology may be preferred, as the most linear amplifier type available. For this reason, CATV networks are dominated by Class A amplifiers. But Class A amplifiers have a theoretical best-case efficiency of 50%, so Class A amplifiers capable of increased output swings from the advanced signals will consume more power. This leads to a major dilemma in the network. On the one hand operators want low distortion for increased bandwidth to serve customers but do not want the added cost and degraded reliability that comes with increased power consumption.

Other classes of amplifiers provide much higher levels of efficiency but they come at cost of degraded distortion performance. Class AB and Class C topologies, for example, can promise >50% efficiencies, but can greatly compromise distortion when such low distortion is still required in the network.

This document describes a technique that can achieve linearity similar to that of a Class A amplifier and the power efficiency benefits similar to that of a Class C or a Class AB amplifier. The present techniques can include using the incoming signal to modulate the bias condition of the amplifier, such as in a manner to increase the dynamic input range, without a corresponding increase in power consumption or distortion. The present techniques can dynamically adjust the Class A operating range, such as only when the input signal needs an increased operating range. As such, the present technique can provide the improved efficiency of Class C or Class AB but with the linearity advantages of Class A. Some amplifiers used in low distortion networks are differential in nature. They can include two amplifiers that are operated out of phase, or can include a single differential amplifier. A well-balanced differential amplifier can nullify even-order distortion terms, such as explained herein.

This document describes, among other things, a power amplifier circuit for broadband data communication over a path in a communication network can reduce or avoid gain compression, provide low distortion amplification performance, and can accommodate a wider input signal amplitude range. A dynamic variable bias current circuit can be coupled to a common emitter bias node of a differential pair of transistors to provide a dynamic variable bias current thereto as a function of an input signal amplitude of an input signal. Bias current is increased when input signal amplitude exceeds a threshold voltage established by an offset or level-shifting circuit. The frequency response of the bias current circuit can track the frequency content of the input signal. A delay in the signal path to the differential pair can phase-align the bias current to the amplification by the differential pair. A dynamic variable supply voltage can be based on an envelope of the input signal.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

A power amplifier circuit for broadband data communication over a path in a communication network can reduce or avoid gain compression, provide low distortion amplification performance, and can accommodate a wider input signal amplitude range. A dynamic variable bias current circuit can be coupled to a common emitter bias node of a differential pair of transistors to provide a dynamic variable bias current thereto as a function of an input signal amplitude of an input signal. Bias current is increased when input signal amplitude exceeds a threshold voltage established by an offset or level-shifting circuit. The frequency response of the bias current circuit can track the frequency content of the input signal. A delay in the signal path to the differential pair can phase-align the bias current to the amplification by the differential pair. A dynamic variable supply voltage can be based on an envelope of the input signal.

Figure 1A:
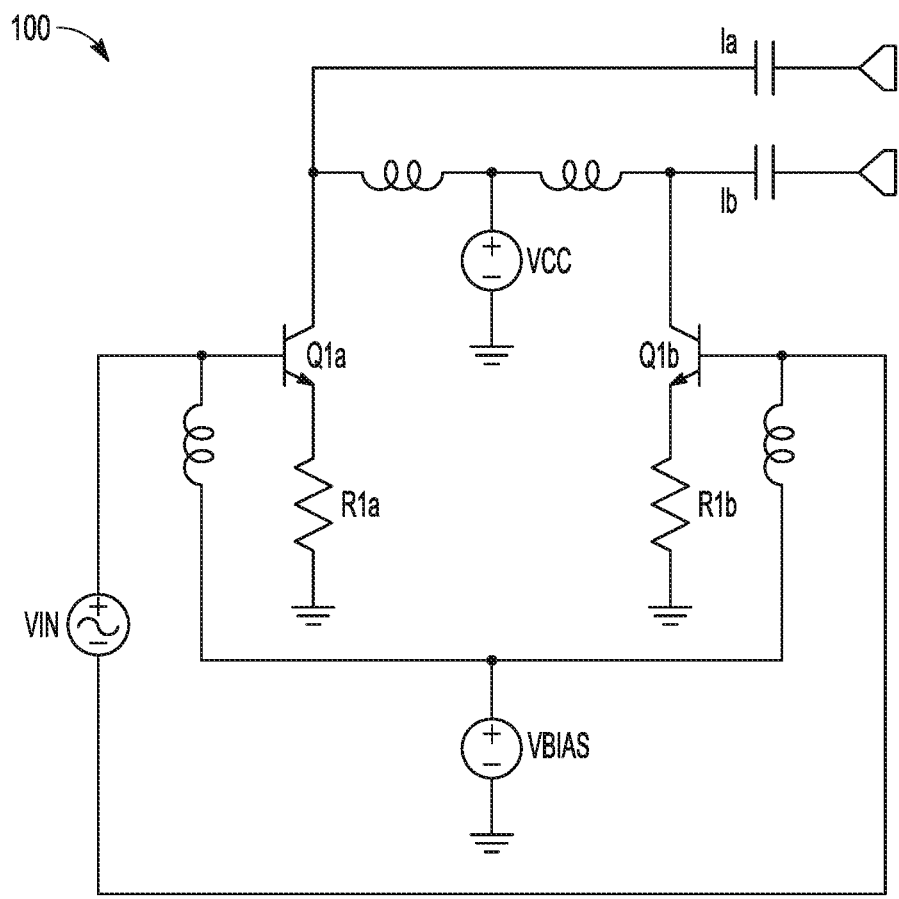
FIG. 1A shows a simplified example of a push-pull transconductance Class A amplifier.
Figure 1B:
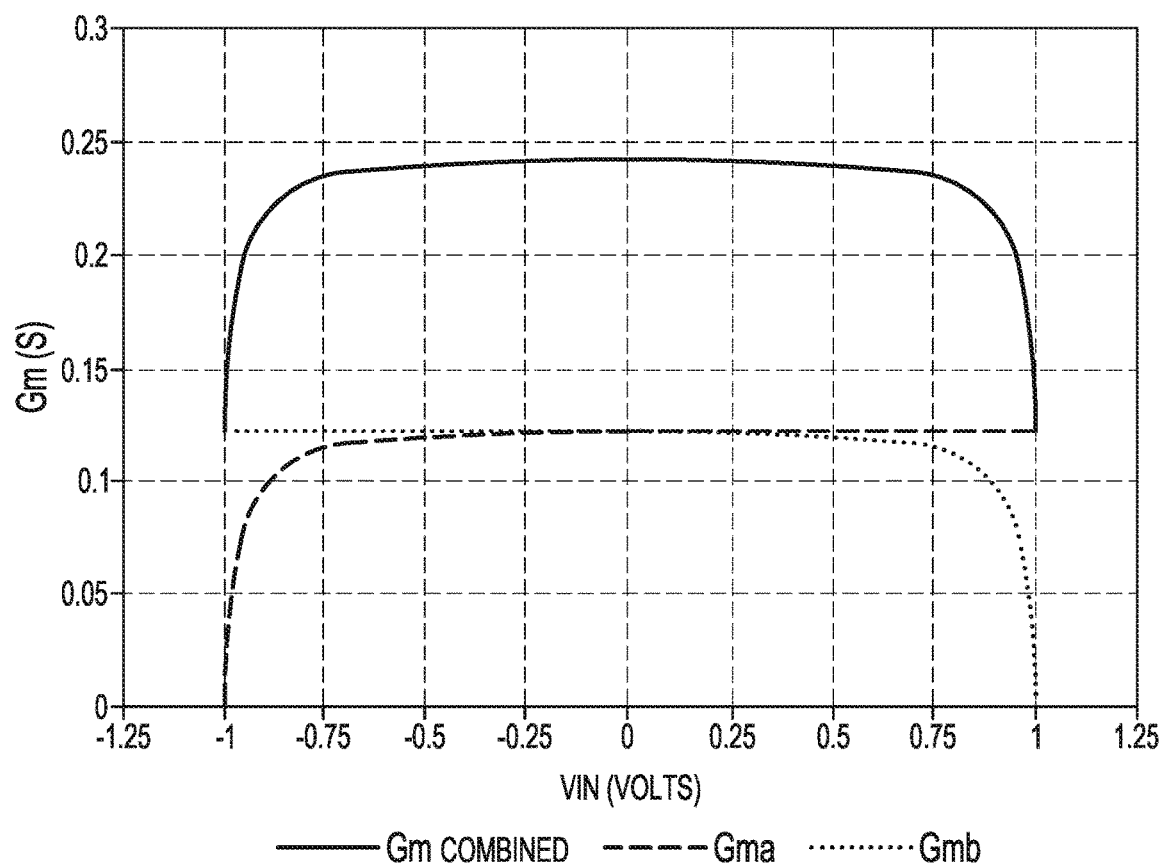
FIG. 1B shows a corresponding graph of transconductance gain (Gm, in Siemens) vs. input signal voltage amplitude (Vin, in Volts).

FIG. 1A shows a simplified example of a push-pull transconductance Class A amplifier 100 circuit such as can convert a differential input voltage, Vin, into two out-of-phase output currents, Ia and Ib. FIG. 1B shows a corresponding graph of calculated transconductance gain (Gm, in Siemens) vs. input signal voltage amplitude (Vin, in Volts). The transconductance gain for each half-circuit is GMa and GMb, respectively, and the combined transconductance of the whole circuit is the sum of GMa with GMb. Gain-establishing or gain degeneration resistors R1a and R1b can be connected in an emitter-follower configuration with the respective bipolar transistors Q1a and Q1b. The resistors R1a and R1b can serve to linearize the native transconductance of the bipolar transistors, Q1a and Q1b, respectively. The respective bases of the bipolar transistors Q1a and Q1b can each be coupled to a common (e.g., shared) DC bias voltage source, such as Vbias, such as via respective inductors, such as shown in FIG. 1A. The respective collectors of the bipolar transistors, Q1a and Q1b can each be coupled to a common (e.g., shared) DC supply bias voltage source, such as Vcc, such as via respective inductors, such as shown in FIG. 1A. The respective collectors of the bipolar transistors, Q1a and Q1b can each be coupled to outputs of the amplifier circuit, such as can present a capacitive differential load, such as shown in FIG. 1A.

Figure 2:
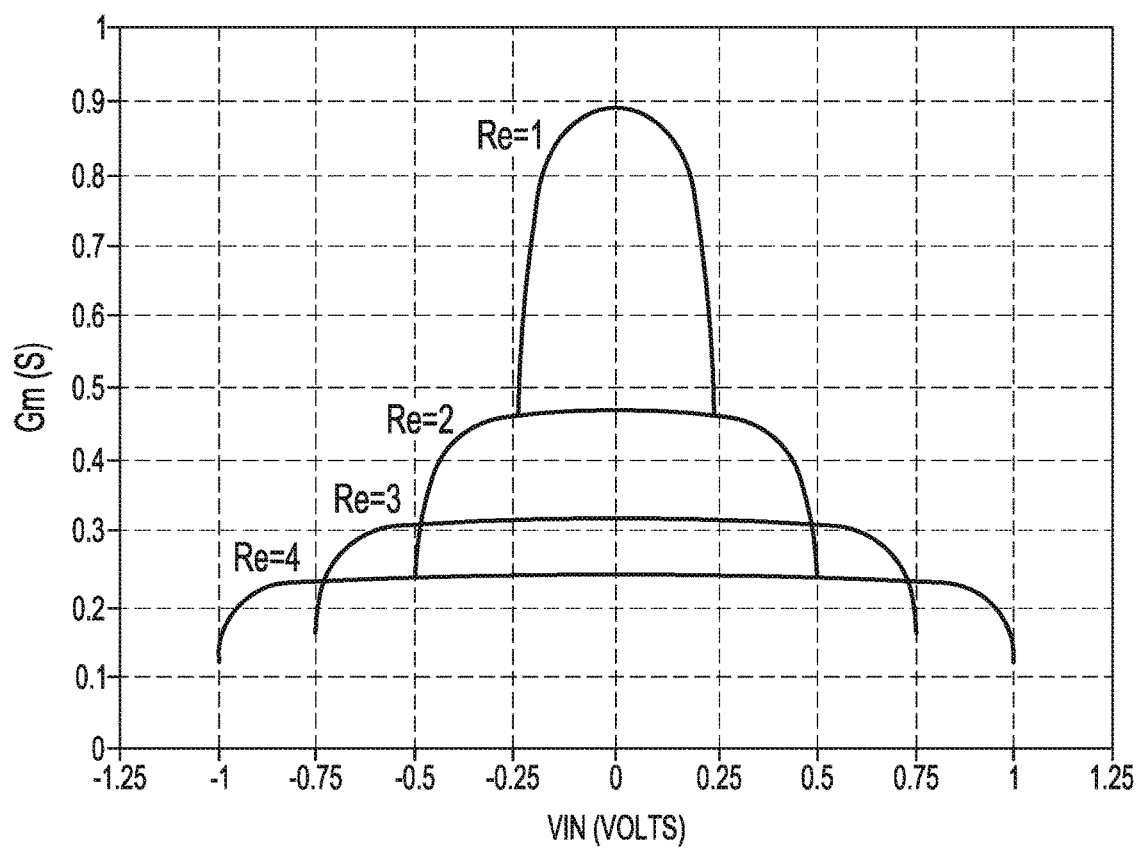
FIG. 2 shows an illustrative calculated example of the differential transconductance gain (Gm, in Siemens) of the amplifier circuit for different values of such gain degeneration, as the input differential voltage (Vin, in Volts) is varied.

FIG. 2 shows an illustrative calculated example of the differential transconductance gain (Gm, in Siemens) of the amplifier circuit 100 of FIG. 1A, such as for different values of such emitter gain degeneration resistors R1a, R1b such as at different resistance levels (such as relative gain degeneration resistance levels presenting different resistance values, Re=1, Re=2, Re=3, Re=4), as the input differential voltage (Vin, in Volts) is varied. As the gain degeneration resistance level is increased, such as using higher-valued resistances of R1a, R1b as compared to a lower gain degeneration resistance level, the overall amplifier transconductance decreases, and extends to accommodate a wider input signal range over a flatter response region. In the example shown in FIG. 1A and FIG. 2, the total bias current is 500 mA. As the input voltage swing approaches extremes on either polarity, the gain of the amplifier circuit 100 starts to fall, corresponding to increasing distortion. As can be seen from the transconductance graphs shown in FIG. 2, the transconductance, Gm, shapes can be flattened and widened to accommodate a broader input signal voltage range, such as by using increasing amounts of gain degeneration, which corresponds to reduced distortion of the input signal in the amplifier circuit 100. However, the reduced distortion comes at the expense of reduced signal gain.

Furthermore, in Class A mode, the amplifier circuit 100 can only provide transconductance gain within a limited range of input voltage, which is commensurate with the amount of bias current applied to the circuit. Although the circuit in FIG. 1A is differential in operation, it is not a true differential pair configuration.

Figure 3A:
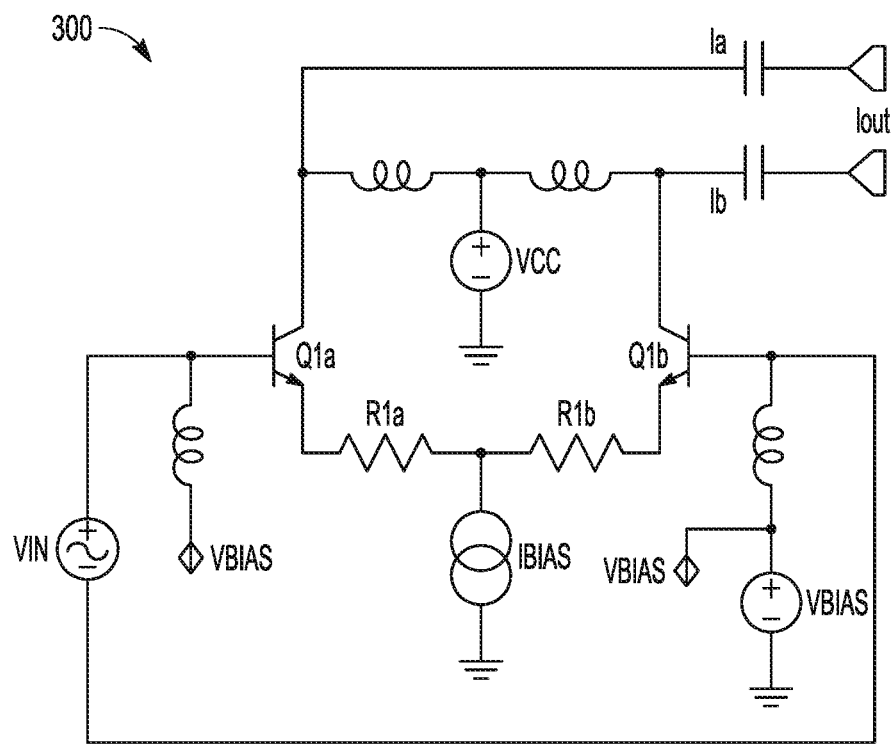
FIG. 3A shows an example of an amplifier circuit that includes a differential pair of transistors, gain degeneration resistors, and a shared current source.

FIG. 3A shows an example of an amplifier circuit 300 that includes such a differential pair of transistors, Q1a and Q1b, and in which the gain degeneration resistors R1a and R1b are connected to (and bias is brought to ground through) a common (e.g., shared) current source Ibias. In this example, the base bias voltages of Q1a and Q1b can be set to a fixed DC value (such as by respective inductors that can be coupled via respective inductors to a common (e.g., shared) bias voltage Vbias) and the common-emitter bias current of the differential pair circuit can be directly controlled by the current source Ibias. As an illustrative example, the gain degeneration resistors R1a and R1b can each be fixed at 2.5 ohms.

Figure 3B:
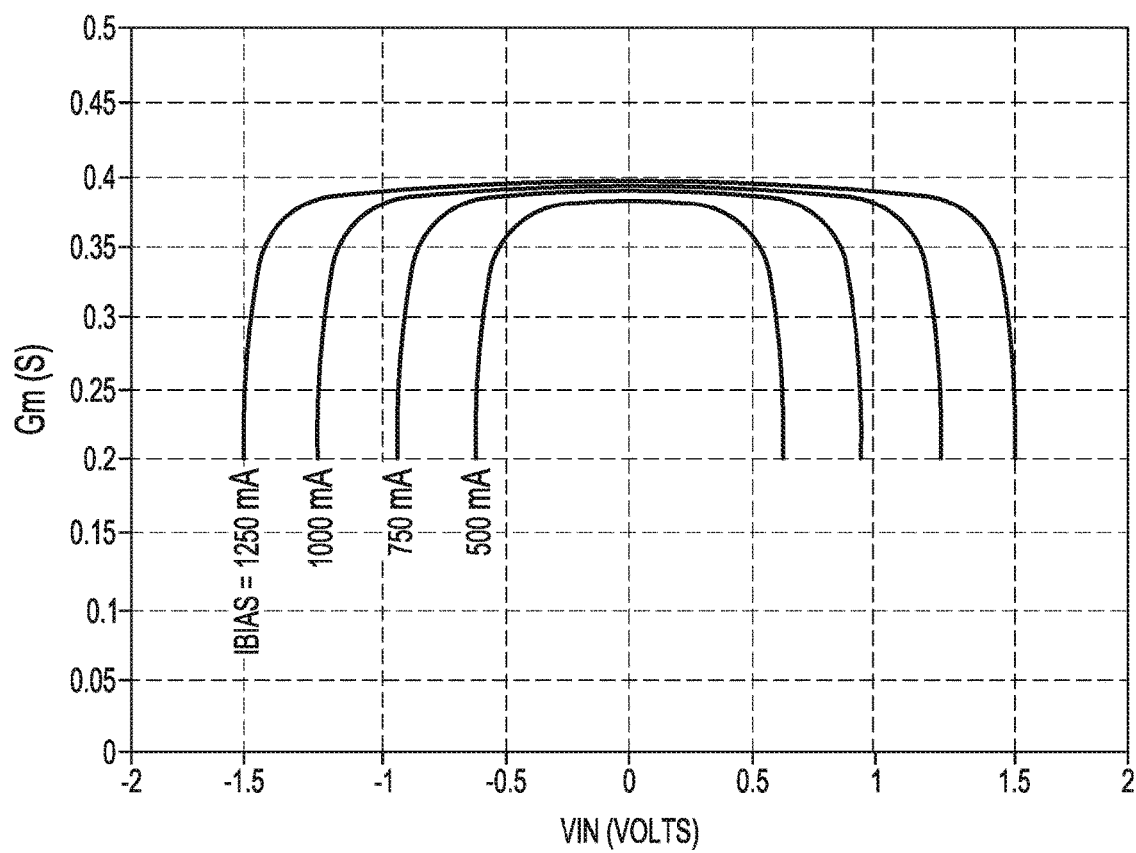
FIG. 3B shows an example a graph of calculated transconductance gain (Gm, in Siemens) vs. input signal voltage (Vin, in Volts) for the amplifier circuit shown in FIG. 3A, with these different current levels represented by respective individual curves in FIG. 3B.

FIG. 3B shows an example a graph of calculated transconductance gain (Gm, in Siemens) vs. input signal voltage (Vin, in Volts) for the amplifier circuit 300 shown in FIG. 3A, for example, as Ibias is adjusted from 500 mA to 1250 mA, with these different current levels represented by respective individual curves in FIG. 3B. A similar calculation for differential transconductance, Gm, for various current values of the current source Ibias shows a nominal transconductance that can be approximated by 1/R1 or 0.4 S. The action of gain degeneration feedback (e.g., a larger input signal voltage amplitude increases the collector current through the transistor Q1a, Q1b and, in turn, through the corresponding gain degeneration resistor R1a, R1b, which decreases the base-emitter junction voltage of the corresponding transistors Q1a, Q1b, thereby tending to reduce the corresponding collector current of the particular transistor Q1a, Q1b in a negative feedback fashion) desensitizes the transconductance response of the transistors Q1a, Q1b for very low values of the input signal, Vin. In FIG. 3B, as the current provided by the current source Ibias is increased, the differential pair Q1a, Q1b in FIG. 3A can maintain a near constant transconductance over a wider input range of input signal voltage, Vin. Hence, as the graph in FIG. 3B shows, increasing the bias current provided by the current source Ibias does little to change the amount of transconductance of the amplifier circuit 300. Instead, it increases the amplitude range of the input signal, Vin, that can be accommodated in the flat region of the transconductance response, such as shown in FIG. 3B, that the amplifier circuit 300 can amplify without large amounts of distortion.

For emerging digitally-modulated signals, the amplitude of the input signal voltage, Vin, can vary considerably with time. Moreover, in some cases, for a large percentage of time the input signal strength (e.g., amplitude) is relatively low. Unfortunately, however, the nature of some such emerging modulation schemes can cause the input signal to have large signal peaks, which can cause an amplifier to generate excessive distortion, thereby leading to what is referred to as "compression." When an amplifier undergoes compression, information modulated onto the signal being amplified is lost—which can lead to dramatic increases in bit error rates. The ratio of peak signal to average signal can be referred to as the "peak-to-average" ratio, which can provide an indication of how difficult a signal can be to amplify. If the bias current provided by the bias current source Ibias in the example of FIG. 3 were increased to an appropriate level to handle the infrequent signal peaks, the power consumption and efficiency of the amplifier would suffer. On the other hand, if the bias current provided by Ibias is kept low, for good efficiency, significant bit errors can accumulate, rendering the amplifier unusable for certain applications.

The present techniques can include, among other things, a circuit that can dynamically adjust bias current, Ibias, such as of a nominally Class A amplifier, such as a direct function of the incoming input signal, Vin, rather than as an indirect function in which the bias current of Ibias is dynamically based on an envelope of the incoming input signal, rather than on the incoming input signal itself. By dynamically adjusting the bias current as a direct function of the incoming input signal, Vin, the frequency content of the dynamically adjusted bias current, Ibias, can track the frequency content of the incoming input signal, Vin, rather than tracking the arbitrary bandwidth of the envelope of the incoming input signal, Vin, as would be the case in an indirect approach. Using the present techniques, the bias current value of Ibias can be adjusted as a direct function of the incoming input signal, Vin, such that the dynamically variable Ibias can be used to enhance gain linearity and provide amplification with reduced distortion. This can permit the transconductance gain, such as shown in FIG. 3B, to be held nearly constant across a wider input signal range of the input signal voltage, Vin. Such adjustment can be made to correspond to an amount of bias current of Ibias needed to maintain acceptably constant or flat transconductance over much wider ranges of input signal voltage, Vin, than would be possible without the present techniques.

Figure 4:
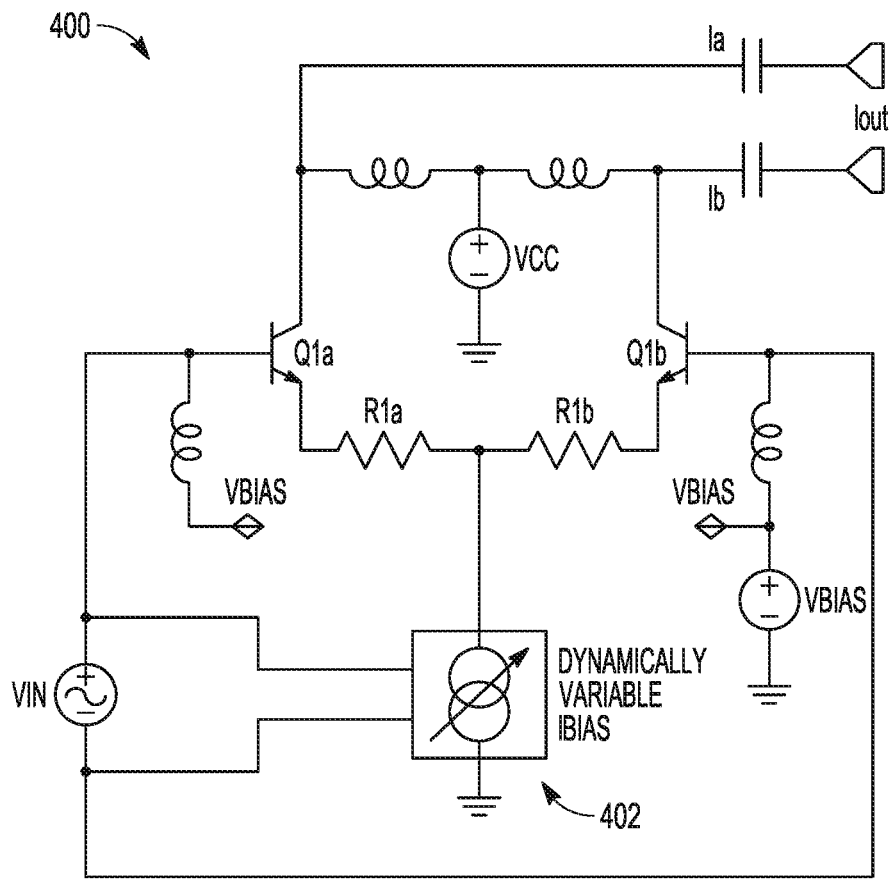
FIG. 4 shows an example of an amplifier circuit that can include a dynamically variable bias current source circuit, Ibias that can receive the input signal, Vin.

FIG. 4 shows an example of an amplifier circuit 400 that can include a dynamically variable bias current source circuit, Ibias 402 that can receive the input signal, Vin. As a direct function of the magnitude of the input signal, Vin, the dynamically variable current source, Ibias 402, can develop a suitable (e.g., non-linear) shaping function to generate the desired dynamically varying bias current of Ibias. In an example, the value of the bias current of Ibias 402 can be dynamically varied as a direct function of the magnitude of the input signal, Vin, such that it is capable of varying with a frequency response that can accommodate frequencies at which the input signal, Vin, varies, rather than varying indirectly, for example, as a function of an envelope of the input signal.

Furthermore, in an example, the dynamically variable bias current source, Ibias 402 can include or be coupled to circuitry that can provide an offset or threshold function, such that the value of the bias current of Ibias 402 is only increased when the input signal voltage, Vin, arrives outside its otherwise useful range. In such an example, for most values of the input signal voltage, Vin, the amplifier circuit 400 can operate in a manner similar to that illustrated in FIGS. 3A and 3B, e.g., in a Class A mode with a low value of bias current provided by the dynamic bias current source Ibias 402, providing low power consumption. Only on those occasions when a large input signal peak of Vin occurs (e.g., exceeding a threshold value, such as can be provided by the offset or threshold circuitry) does the dynamically variable bias current source 402 dynamically increase the bias currents in Q1a and Q1b to extend the differential transconductance operating range, thereby avoiding or reducing compression. Incoming input signals with high values of peak-to-average signal voltage will rarely require adjustments in Ibias to inhibit or prevent waveform clipping. Consequently, the net increase in average bias current is much less than otherwise would be required without using the present techniques. The present techniques can help increase output signal range to handle high peak-to-average signals without needing a longer duration increase in bias current.

In FIG. 4, the dynamically variable bias current source can be configured to extend the operating range of the amplifier circuit 400. For most applications, the direct function Ibias(Vin) will be dominated by even-order characteristics. That is, the function Ibias(Vin) will have the same result independent of the sign of Vin. That is, a large positive value of Vin will generate the same increase in the bias current provided by Ibias 402 as would the same magnitude but negative value of Vin.

Figure 5:
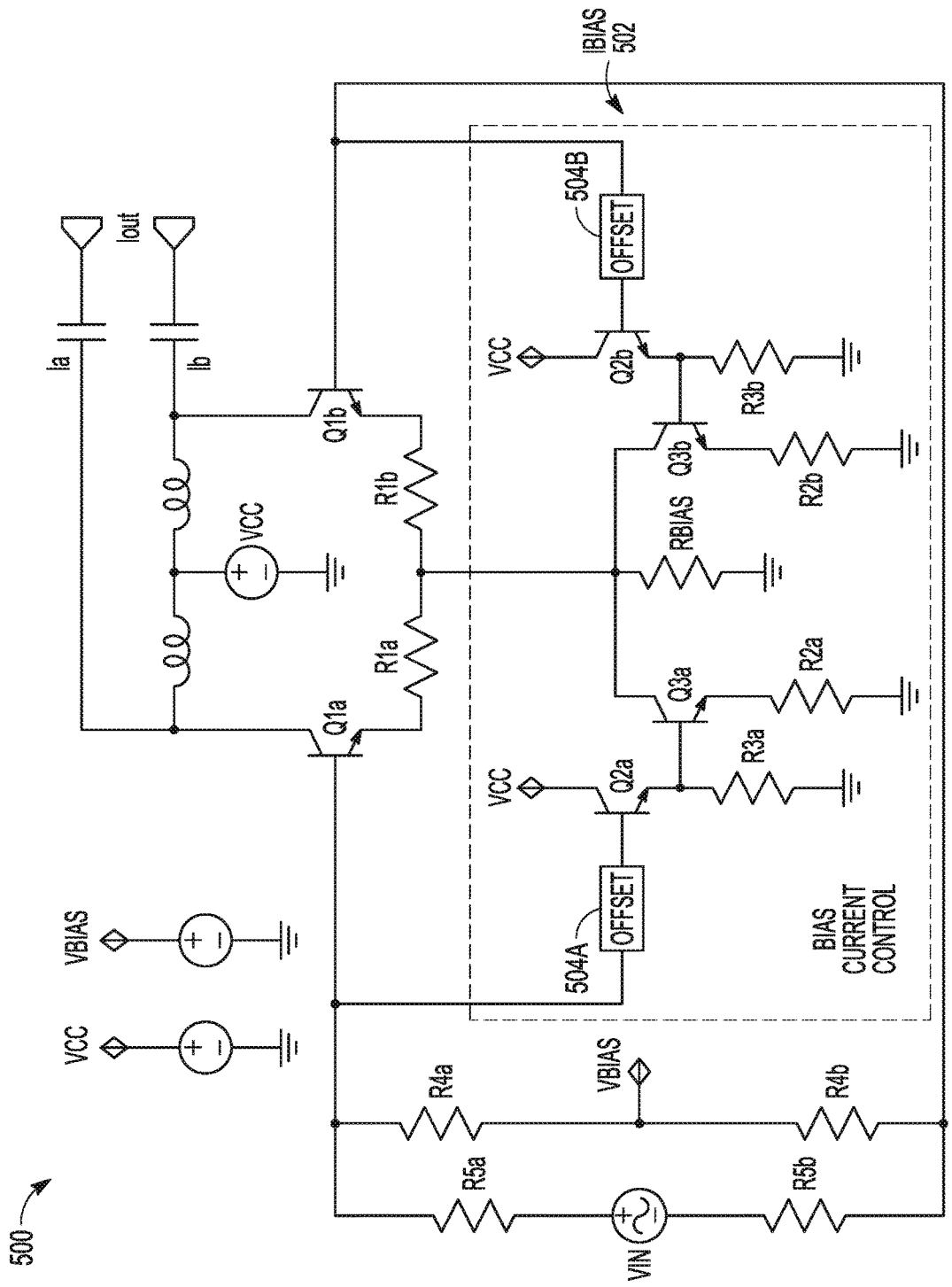
FIG. 5 shows an example of an amplifier circuit, similar to that shown in FIG. 4, but including a more detailed example of a dynamically variable bias current source, Ibias.

FIG. 5 shows an example of an amplifier circuit 500, similar to that shown in FIG. 4, but including a more detailed example of a dynamically variable bias current source, Ibias 502. In an example, the dynamically variable bias current source Ibias 502 can include a resistor, Rbias, that is connected to and between each of the gain degeneration resistors R1a and R1b respectively associated with individual ones of the differential pair of transistors Q1a, and Q1b. Bias current control circuitry can include transistors Q2a, Q2b, Q3a, Q3b, and buffer or offset voltage circuits 504A, 504B. The buffer or offset voltage circuits 504A, 504B can perform a low impedance voltage level-shifting function on the incoming input signals provided by Vin, such as via the resistors R5a, R5b. The voltage signals incident to the bases of Q1a and Q1b can also form the differential input to the dynamically variable bias current source circuit 502. The buffer or offset voltage circuits 504A, 504B can shift this input signal voltage to the dynamically variable bias current source circuit 502A, such as by a specified or predetermined amount. The transistors Q2a and Q2b can also provide a buffering function, such as can help inhibit or prevent loading on the bases of the transistors Q1a and Q1b of the differential pair that can otherwise occur. When the amplitude of input signal, Vin, is large enough to exceed a specified threshold value, then the transistors Q3a and Q3b turn on, and force an increase of bias current in the transistors Q1a and Q1b, such as by augmenting that current already being provided to the common-emitter differential pair circuit through the bias resistor, Rbias.

In FIG. 5, the amplifier circuit 500 can be configured or optimized for providing an adequately wide flat region of differential transconductance, such as by adjusting the values of the offset voltage provided by the buffer or offset voltage circuits 504A, 504B. This, in turn, controls the level of input signal, Vin, needed to initiate the increase in bias current that can be dynamically provided by turning on one or both of the transistors Q3a and Q3b in parallel with the current already being provided through the bias resistor, Rbias. The resistance values of the resistors R2a and R2b, which are respectively coupled to the emitters of Q3a, Q3b, control the ramp up in auxiliary or augmenting bias current being provided by Q3a, Q3b as the magnitude of the input signal, Vin, is increased.

In FIG. 5, the resistors R4a and R4b (or alternatively inductors, such as shown in FIG. 4) can be respectively coupled between the inputs (e.g., bases) of the transistors Q1a, Q1b, of the differential pair of transistors, respectively coupling each to a common bias voltage terminal, Vbias. The resistance values of the resistors R4a and R4b determine the shift in voltage across the bases of the transistors Q1a and Q1b of the differential pair, due to the small base currents drawn by the transistors Q2a, Q3a, Q2b, and Q3b as the transistors Q3a and Q3b turn on to dynamically adjust the auxiliary bias current being provided by Q3A, Q3b to the differential pair configuration of the transistors Q1a and Q1b, augmenting the bias current being provided to the differential pair configuration of the transistors Q1a and Q1b through the bias resistor Rbias.

Figure 6:
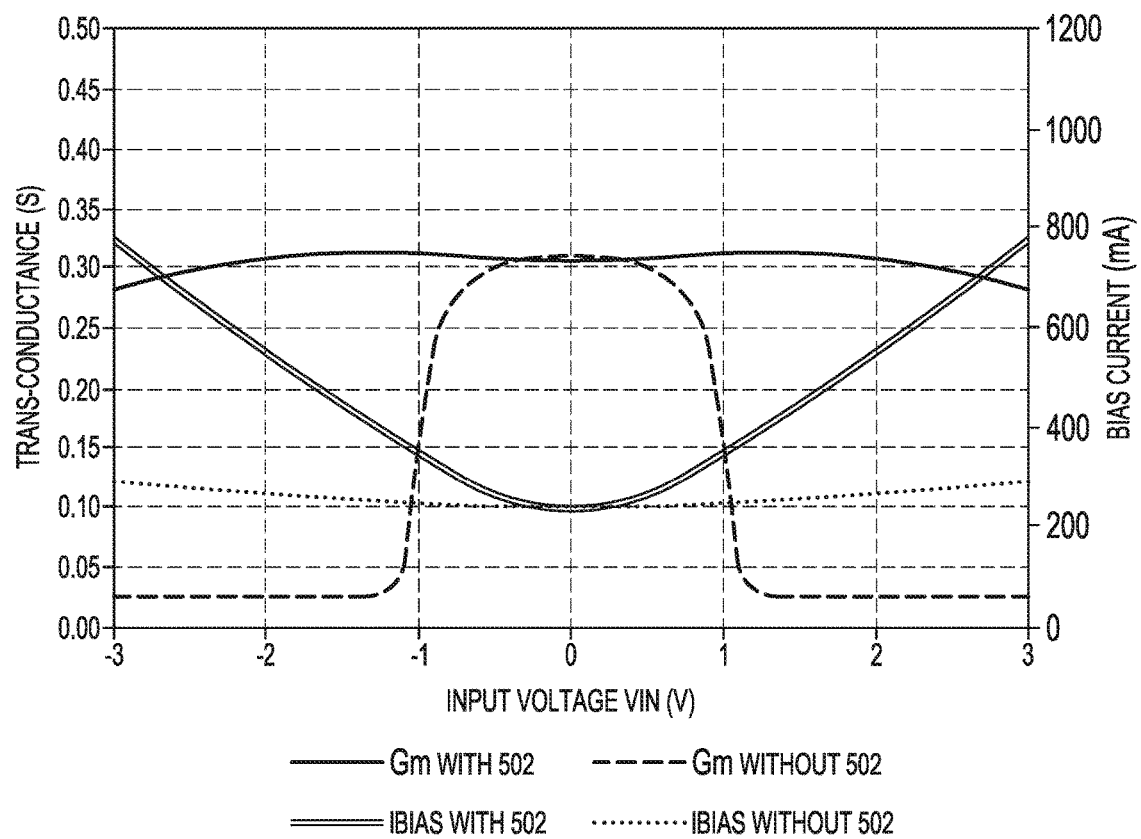
FIG. 6 is an example of a graph of calculated transconductance (Gm, Siemens) and bias current (mA) vs. input voltage (V), which shows a benefit of the present approach, including the dynamically variable bias current source of FIG. 5, as compared to an approach without including the dynamically variable bias current source but still including the bias current resistor.

FIG. 6 is an example of a graph of calculated transconductance (Gm, Siemens) and bias current (mA) vs. input voltage (V), which shows a benefit of the present approach, including the dynamically variable bias current source Ibias 502 of FIG. 5, as compared to an approach without including the dynamically variable bias current source 502 but still including the bias current resistor, Rbias.

With the dynamically variable bias current circuit Ibias 502, a much wider range of input signal with a reasonably flat transconductance is maintained. In this example, bias current is increased only when the input voltage condition warrants additional expenditure of power. For emerging modulation schemes with high peak-to-average ratios, this increase in bias current rarely happens. This means that the increase in time-averaged bias current will be minor. However, since the transconductance, Gm, is maintained relatively flat across this wider range, the approach using the dynamically variable bias current circuit Ibias 502 is capable of operating with much fewer bit-errors than the approach without using the dynamically variable bias current circuit Ibias 502.

Figure 7:
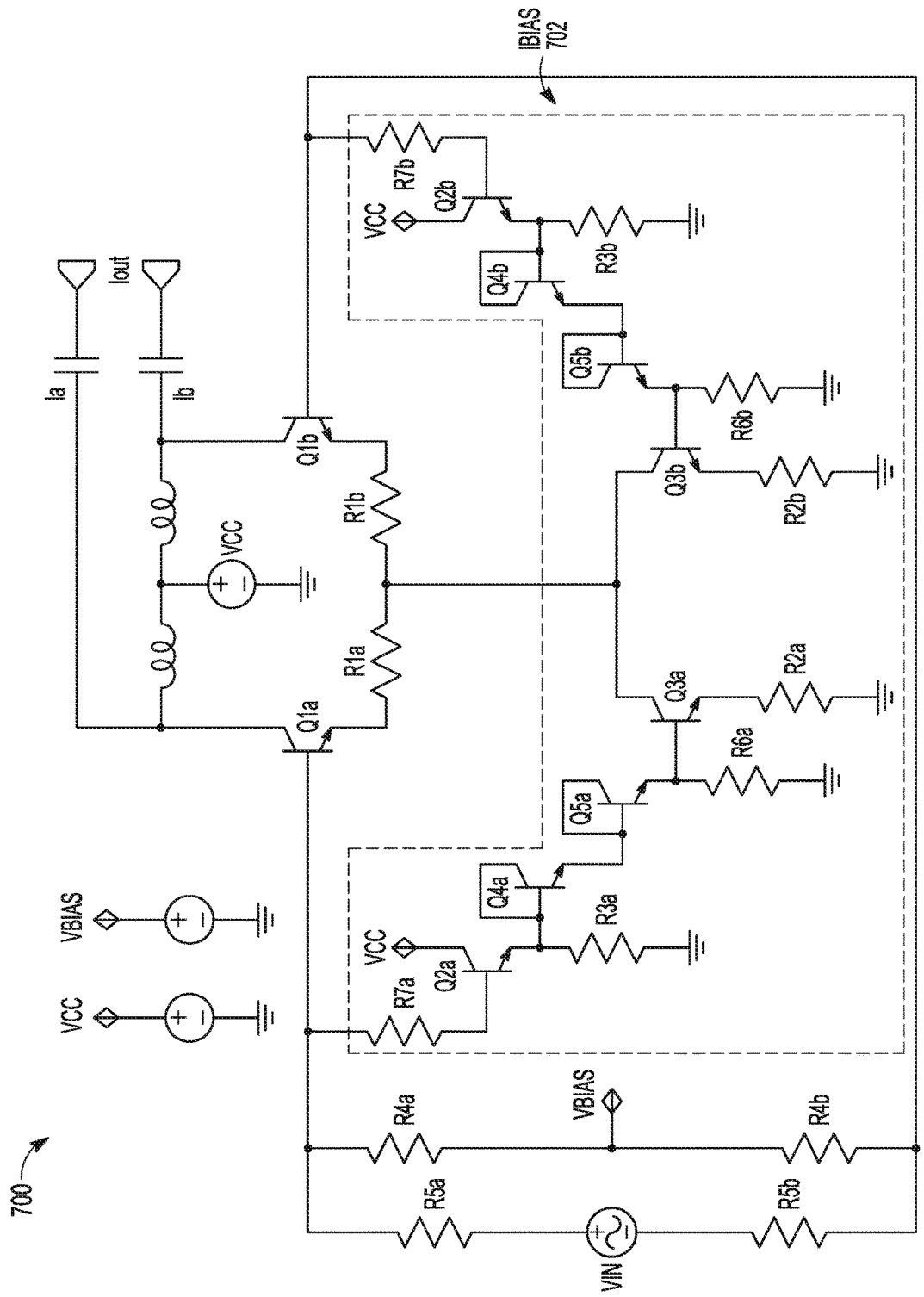
FIG. 7 shows another example of an amplifier circuit such as can include buffer circuitry and offset or level-shifting circuitry.

FIG. 7 shows another example of an amplifier circuit 700 consistent with the teachings of the present approach. FIG. 7 shows an example of a dynamically variable bias current circuit 702, which is similar in some respects to the dynamically variable bias current circuit 502, as explained with respect to FIG. 5. In FIG. 7, the dynamically variable bias current circuit 702 can include buffer circuitry, such as can include transistors Q2a, Q2b. Such buffer circuitry can help inhibit or prevent the dynamically variable bias current circuit Ibias 702 from excessively loading the inputs to the main transistors Q1a, Q1b forming the input transconductors of the differential pair amplifier. Resistors R7a and R7b can respectively couple the inputs (e.g., base terminals) of the buffering transistors Q2a, Q2b to receive the input signal, Vin, such as to the respective inputs (e.g., base terminals) of the main transistors Q1a, Q1b. The collectors of the buffering transistors Q2a, Q2b can respectively be directly or indirectly electrically connected to a reference or supply voltage, such as to an upper supply voltage rail, Vcc. The emitters of the buffering transistors Q2a, Q2b can respectively be coupled to a reference or supply voltage, such as to a ground voltage, such as respectively through resistors R3a, R3b. The resistance values of the resistors R3a, R3b can be selected to keep the buffer transistors Q2a, Q2b in their forward active operating region, such as over the extended range of input voltage swing, such that any time delays associated with their operation can be kept relatively constant.

In the dynamically variable bias current circuit 702, the transistors Q4a, Q4b, Q5a, Q5b can be included such as to provide a voltage offset or to perform level-shifting. In the example shown in FIG. 7, the transistors Q4a, Q4b, Q5a, Q5b can be diode-connected (e.g., with respective base terminals electrically connected to corresponding respective collector terminals), such as to provide the voltage offset or level-shifting. As shown, the series configuration of Q4a with Q5a provides a level-shifting of two forward-biased diode voltage drops, as does the series configuration of Q4b with Q5b. Such offset or level-shifting can help establish the magnitude of input voltage excursions that actually trigger the dynamic supplementary or auxiliary increase in bias current to the transistors Q1a, Q1b of the differential pair circuit. The resistance values of the resistors R6a, R6b can be selected such as to establish the nominal currents of the transistors Q4a, Q4b, Q5a, and Q5b. In this example shown in FIG. 7, the bias currents for the differential pair of transistors Q1a, Q1b, for low values of Vin, can be set through Q3a, Q3b and R2a, R2b. Alternatively, the bias resistor Rbias (such as shown in FIG. 5) can optionally be additionally included in the example of FIG. 7, such as to help establish the bias currents for the differential pair of transistors Q1a, Q1b, for low values of Vin. In the absence of including a bias resistor Rbias, such as shown in FIG. 5, a quiescent bias current can be respectively provided to the base terminals of each of the transistors Q3a, Q3b, such as by including respective bias resistors between such base terminals of the transistors Q3a, Q3b and an appropriate supply voltage (e.g., Vcc) or reference voltage (e.g., Vbias). Such biasing of Q3a, Q3b can provide appropriate quiescent currents from the collectors of Q3a, Q3b to the differential pair transistors Q1a, Q1b such as to provide operation of the differential pair transistors Q1a, Q1b in a forward-active region of operation such as for amplifying the input signal when Ibias is at its quiescent value, rather than its dynamically-boosted value.

Figure 8:
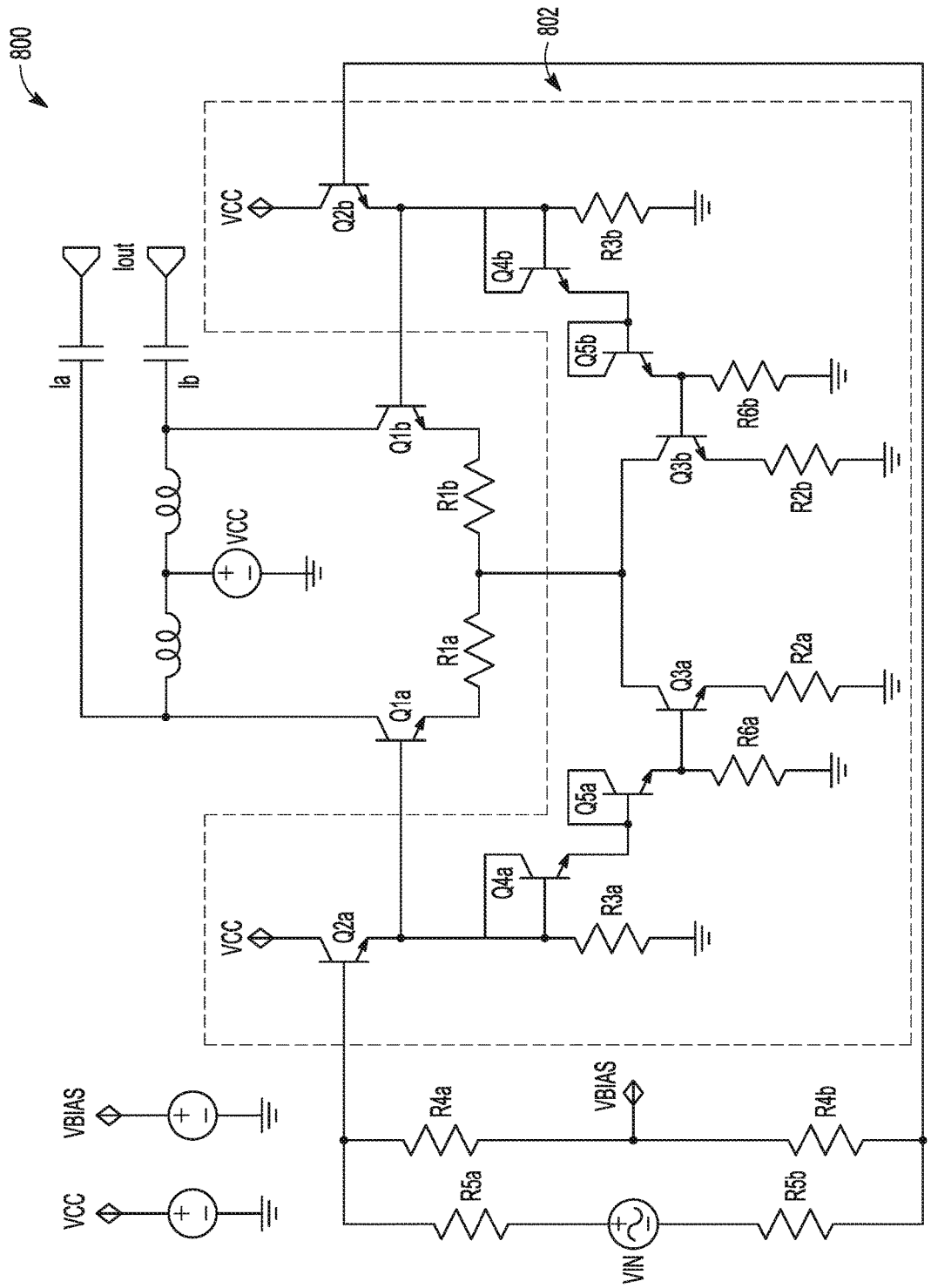
FIG. 8 shows another example of an amplifier circuit such as can include buffer circuitry and offset or level-shifting circuitry, such as can share the buffer circuitry with the signal path to the differential amplifier

FIG. 8 shows another example of an amplifier circuit 700 consistent with the teachings of the present approach. FIG. 8 shows an example of a dynamically variable bias current circuit 802, which is similar in some respects to the dynamically variable bias current circuit 702, as explained with respect to FIG. 7. In FIG. 8, the dynamically variable bias current circuit 802 can include buffer circuitry, such as can include transistors Q2a, Q2b, which in this example can be located in-line with the input signal path to the differential pair transistors Q1a, Q1b. FIG. 8 shows an example of a Darlington-type configuration, such as with the respective bases of the buffer transistors Q2a, Q2b receiving the input signal, Vin, and with the emitters of the buffer transistors Q2a, Q2b respectively connected to the base terminals of the differential pair transistors Q1a, Q1b. The collectors of the buffer transistors Q2a, Q2b can be electrically connected to a supply voltage reference, such as VCC, or alternatively to the corresponding collectors of the differential pair transistors Q1a, Q1b, respectively, for biasing. The emitters of the buffer transistors Q2a, Q2b can be connected to a negative supply reference or ground voltage, such as through the resistors R3a, R3b, respectively. The offset or level shifting circuits provided by Q4a, Q5a, Q4b, Q5b can take their inputs from the emitters of Q2a and Q2b and, as in the circuit of FIG. 7, can each operate in the forward-active region, such as can provide a consistent time response.

Figure 9:
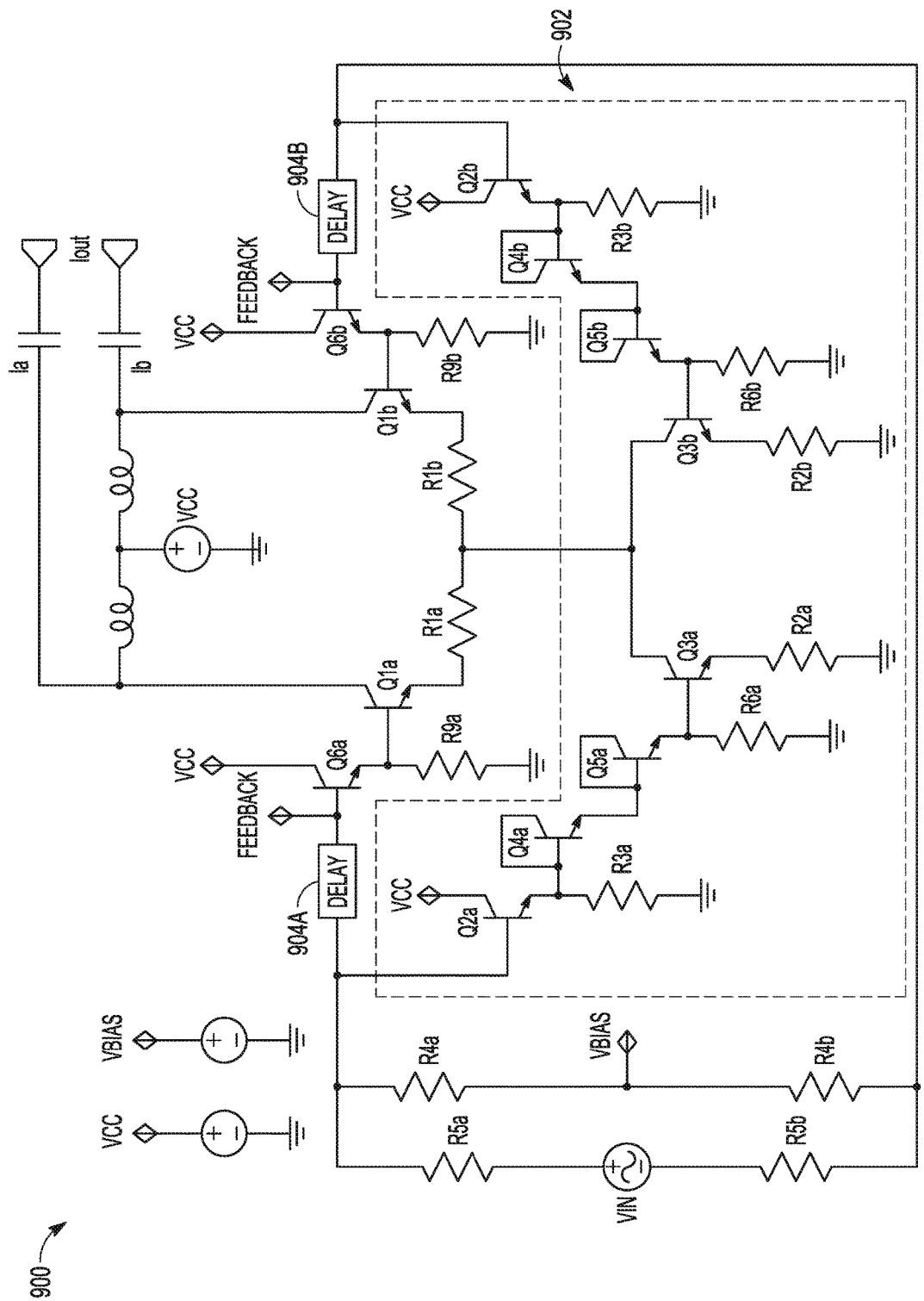
FIG. 9 shows an example of an amplifier circuit such as can include a dynamic bias current circuit, such as can include separate buffer transistors, such as for providing in-line buffering of the differential pair transistors, and such as can include a delay in the signal path such as for providing phase alignment.

FIG. 9 shows an example of an amplifier circuit 900 such as can include a dynamic bias current circuit 902, such as can include separate buffer transistors Q6a, Q6b, such as for providing in-line buffering of the differential pair transistors Q1a, Q1b. A separate pair of buffer transistors Q2a, Q2b can help inhibit loading by the dynamic bias current circuit 902. Respective delay circuits 904a, 904b can be included, such as to help balance the phase delay response of the input signal modulating the bias current via Q3a, Q3b with that of the primary signal-amplification path through the differential pair transistors Q1a, Q1b, so that the increase in bias current needed for large voltage excursions of Vin can be timely available through the differential pair transistors Q1a, Q1b when needed for amplifying the signal undergoing such large amplitude voltage excursions.

The circuit in FIG. 9 can help overcome the challenge of aligning the input signal, Vin, to the optimum phase of the bias current being dynamically adjusted and provided to the differential pair Q1a, Q1b by the transistors Q3a, Q3b. In this example, the buffer transistors Q6a, Q6b can be configured in a Darlington arrangement to buffer the input signal to the differential pair transistors Q1a, Q1b. Separate buffer transistors Q2a, Q2b can be arranged to buffer the amplifier inputs from the circuitry of the dynamic current bias circuit 902. To help align phase responses, delay circuits 904a, 904b can be included in the signal path, such as after such signal inputs are received by the dynamic current bias circuit 902, and before the Darlington inputs of the buffer transistors Q6a, Q6b. In an example, the delay circuits 904a, 904b can include RC or LC passive low-pass filter circuits such as to help provide a desired amount of phase delay. In an example, the delay circuits 904a, 904b can additionally or alternatively include coaxial delay lines such as to help provide the desired amount of phase delay. This can help provide valuable flexibility, such as when applying the present approach in a narrowband application, such as can be desirable for a wireless high-power amplifier application. Shunt feedback (such as shown in FIG. 10), if any, can be applied in the signal path after the delay circuits 904a, 904b (e.g., such as at the nodes marked "FEEDBACK" in FIG. 9), such as to help avoid burdening the phase margin of the shunt feedback loop, such as explained further below with respect to FIG. 10.

The examples described with respect to the preceding FIGS. can convert an input voltage signal, Vin, to output currents Ia, Ib, which can form a useful building block for many practical circuit applications. In various examples, the differential output current Iout in FIGS. 4-5 and 7-9 can be combined, such as using an impedance transformer circuit, such as can convert the high output impedance into a suitable lower impedance, such as for transmission in a broadband system such as in a cable television type communication system. In an example, impedance transformation can be provided by including a cascode circuit topology, an example of which is shown in FIG. 10.

Figure 10:
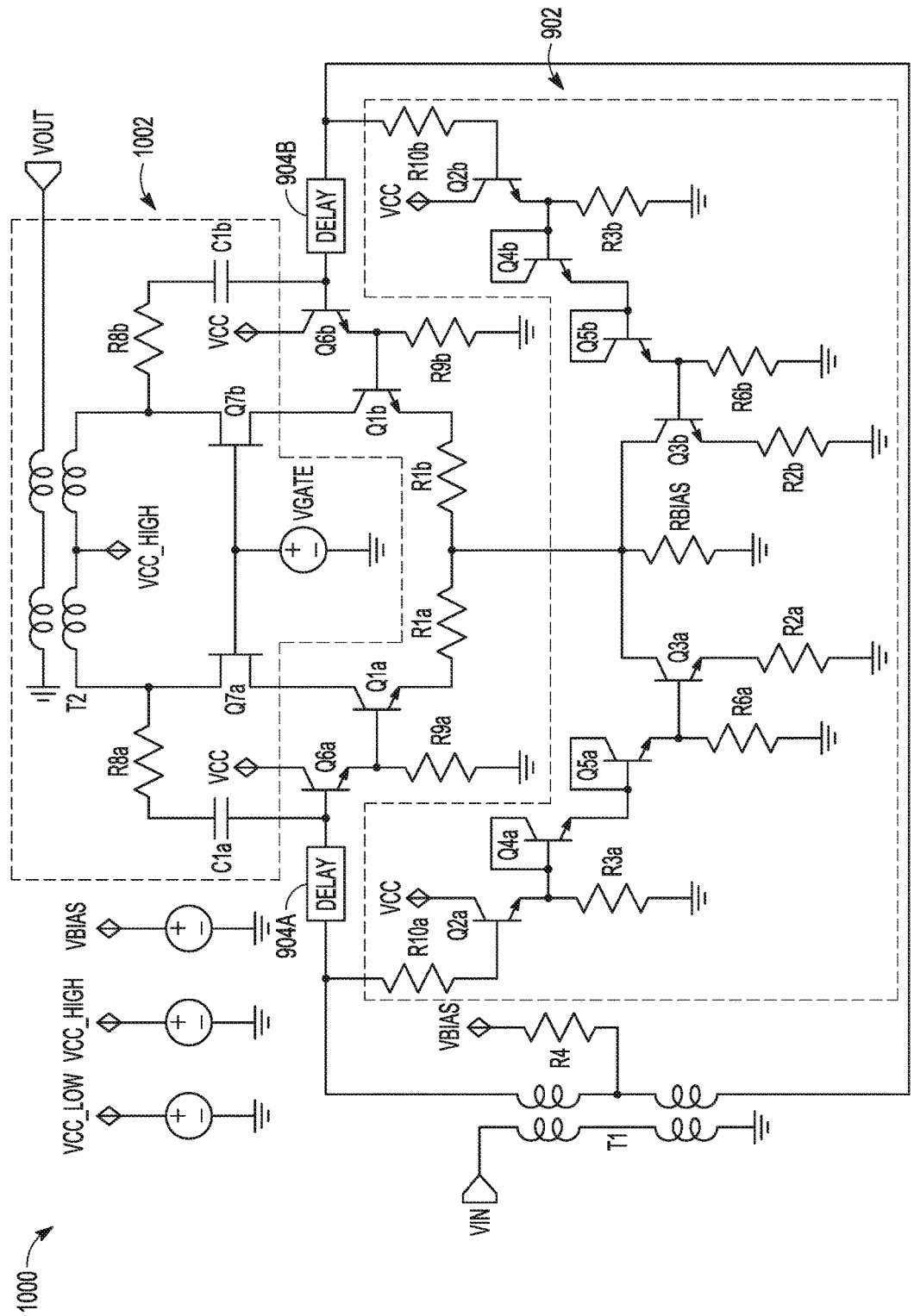
FIG. 10 shows an example of an amplifier circuit that can include a cascode or transformer-coupled output circuit.

FIG. 10 shows an example of an amplifier circuit 1000 that can include a cascode output circuit 1002 coupled to the legs of the differential pair circuit of the transistors Q1a, Q1b, such as being coupled thereto at the respective collectors of the differential pair transistors Q1a, Q1b. In an example, the cascode output circuit 1002 can include cascode field effect transistor (FET) or other transistors Q7a, Q7b, such as can respectively include their FET source terminals being respectively coupled to the corresponding collector terminals of the differential pair transistors Q1a, Q1b. The cascode transistors Q7A, Q7b can take the collector currents of the respective differential pair transistors Q1a, Q1b and convert them into a suitably high voltage, such as for transformer T2 to convert into a common impedance. The impedance ratio of the transformer T2 can be specified, such as to maximize or achieve a desired value of power efficiency. Common impedance ratios of the transformer T2 can range from 1-to-1 up to 4-to-1 with the larger impedance of the radio being applied on the cascode devices Q7a, Q7b. Thus, output cascode devices Q7a, Q7b should be selected or configured to be able to handle the resulting high voltage swings due to the transformer T2. In an example, Gallium Nitride (GaN) or other compound semiconductor FET can be well-suited for this task. The gate terminals of the cascode transistors Q7a, Q7b can be biased by a low current supply voltage reference, such as the bias reference voltage source Vgate shown in FIG. 10. This can be accomplished using a biasing network within the bias reference voltage source Vgate that can include one or more resistive components, one or more Zener or other diode components, or a combination of these.

As explained previously, the amplifier circuit 1000 can include a dynamic current bias circuit 902, such as can include separate buffer transistors Q2a, Q2b from the buffer transistors Q6a, Q6b used in the signal path for buffering the input signal being provided to the differential pair transistors Q1a, Q1b. In the dynamic current bias circuit 902, the transistors Q4a, Q4b, Q5a, Q5b can provide the offset or level-shifting function, such as explained previously. Delay circuits 904a, 904b can be included, such as explained previously. The dynamic current source transistors Q3a, Q3b can serve to dynamically increase the bias current (e.g., as a direct function of the input signal, albeit with buffering and level-shifting), such as to help maintain constant transconductance gain for large amplitude values of the input signal, Vin. The input signal can be transformer-coupled into the amplifier circuit 1000, such as via the transformer T1. The transformer T1 can serve to accept and transform an unbalanced input signal, Vin, into a balanced signal such as to drive the amplifier circuit 1000 differentially.

In FIG. 10, the amplifier can provide a series-shunt feedback configuration. For example, gain degeneration resistors R1a, R1b coupled to the emitters of the differential pair of transistors Q1a, Q1b can provide series negative feedback for stabilizing the amplifier by tending to reduce the base-emitter voltages of the differential pair of transistors Q1a, Q b at larger values of collector/emitter current. The resistors R8a, R8b and their respective series capacitors C1a, C1b can provide shunt feedback for operating the amplifier. By including the delay circuits 904a, 904b in the input signal path before the "FEEDBACK" points in FIG. 9 at which the shunt feedback is provided by the respective resistors R8a, R8b and the respective capacitors C1a, C1b of FIG. 10, excessive phase shift within the shunt feedback loop can be avoided. This can help preserve adequate phase margin for maintaining stable operation of the amplifier, such as when using the shunt feedback such as shown in the example of FIG. 10.

Figure 11:
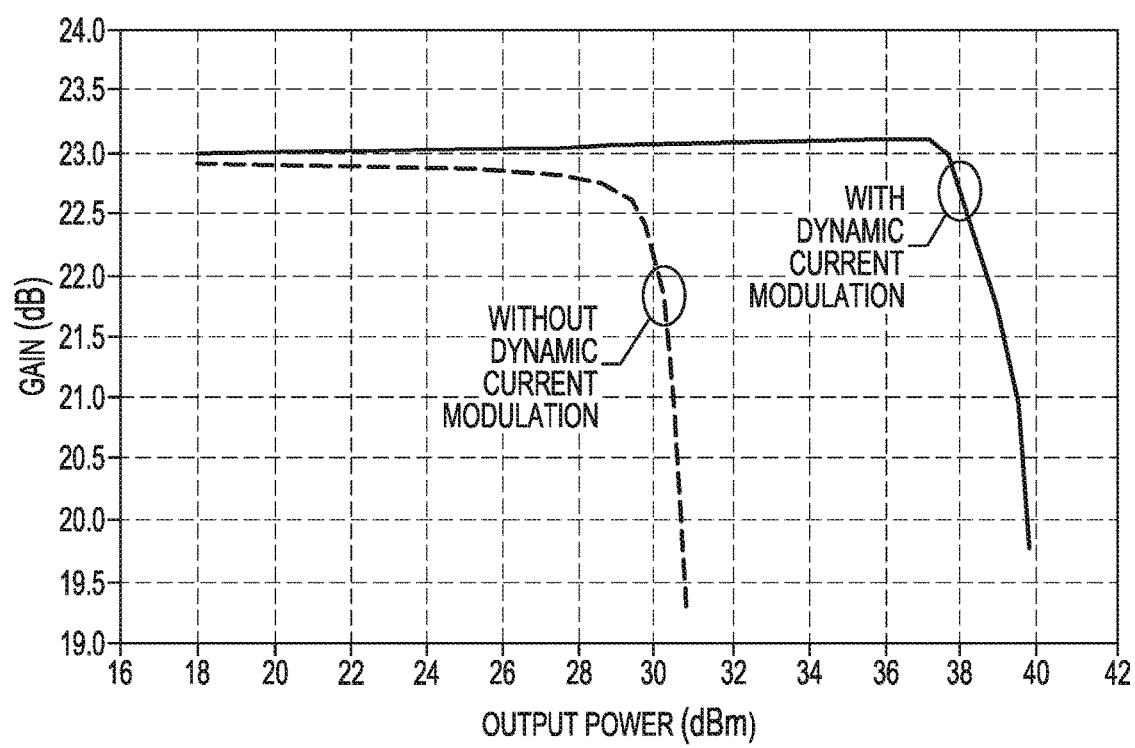
FIG. 11 is a calculated graph of gain (in decibels, dB) vs. output power (in decibels below 1 mW, dBm) comparing the gain compression of the amplifier circuit topology shown in FIG. 10 with and without dynamic bias current modulation.

FIG. 11 is a calculated graph of gain (in decibels, dB) vs. output power (in decibels below 1 mW, dBm) comparing the gain compression of the amplifier circuit 1000 topology shown in FIG. 10 with and without the above-described dynamic bias current modulation as a direct function of the input voltage signal. The gain compression performance of an amplifier is the output power where gain has dropped by a predetermined amount.

For the purposes of the comparison shown in FIG. 11, the same nominal bias current and voltage are used for the comparative examples with and without the dynamic bias current modulation. Since large input signal voltage amplitude excursions occur rarely, high power operation of the amplifier circuit 1000 using the dynamically increased additional bias current occurs very rarely, such that the associated penalty rise in DC current when using the dynamic bias current modulation is very small. FIG. 11 shows that using the dynamic bias current modulation can provide an increase in 1-dB compression performance of more than 8 dB.

Figure 12:
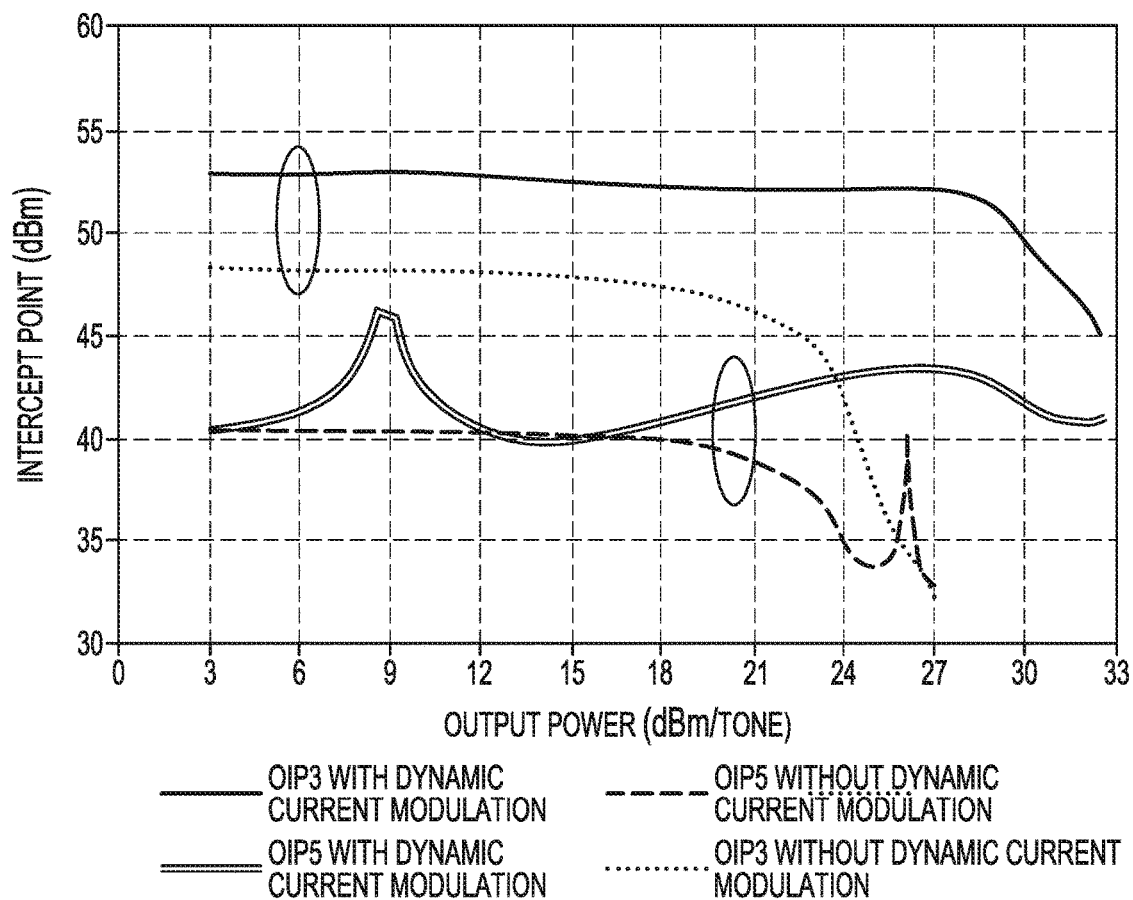
FIG. 12 is a graph of intercept point (decibels under 1 mW, dBm) vs. output power (decibels under 1 mW, dBm)/tone for the amplifier circuit shown in FIG. 10, showing third-order output axis intercept point (OIP3) and fifth-order output axis intercept point (OIP5) with and without the dynamic bias current modulation circuit.

FIG. 12 is a graph of intercept point (decibels under 1 mW, dBm) vs. output power/tone (decibels under 1 mW, dBm) for the amplifier circuit 1000 shown in FIG. 10, showing third-order output axis intercept point (OIP3) and fifth-order output axis intercept point (OIP5) with and without the dynamic bias current modulation circuit 902. A measure of performance for a linear amplifier can be given by its output odd-order intermodulation distortion terms, such as third-order intermodulation distortion (IMD3) and fifth-order intermodulation distortion (IMD5), which are the respective ratios of power in the third-order or fifth-order distortion products, relative to the fundamental power at the fundamental frequency. Lower levels of IMD3 and IMD5 are strongly desirable. As input signal amplitude is increased IMD3 and IMD5 will increase. When an amplifier undergoes compression, these terms IMD3 and IMD5 can dramatically rise. A useful expression characterizing intermodulation performance of an amplifier is OIPx, where "x" is the order of distortion product, and is the hypothetical power level at which the IMD level equals the fundamental power. When an amplifier undergoes compression, OIP3 and OIP5 will drop dramatically, indicating that bit errors are likely to accumulate quickly. Simulated OIP3 and OIP5 for the circuit of FIG. 10 (with and without the dynamic bias current modulation) is shown in FIG. 12. As seen in FIG. 12, using the present dynamic bias current modulation can help provide a considerable increase in output power before compression occurs. In FIG. 12, both OIP3 and OIP5 maintain the same or higher levels with the present dynamic bias current modulation as compared to without. In this example, the same topology and nominal bias current are used, with the dynamic bias current modulation providing a temporary increase in bias current for large input signal magnitudes.

Referring to FIG. 4, the function Ibias(Vin) can be established or optimized with a goal of reducing or minimizing both the even and odd order distortion terms of each output current Ia and Ib. In a truly differential implementation, the second order terms within the quantity Ia and Ib can be shown to cancel each other, but in practice, such cancellation is not perfect. Thus, it can be desirable to reduce or minimize second order products within each term. Alternatively or additionally, a second order cancellation circuit can be used, such as to reduce resulting second order currents, such as shown in the example of FIG. 13.

Figure 13:
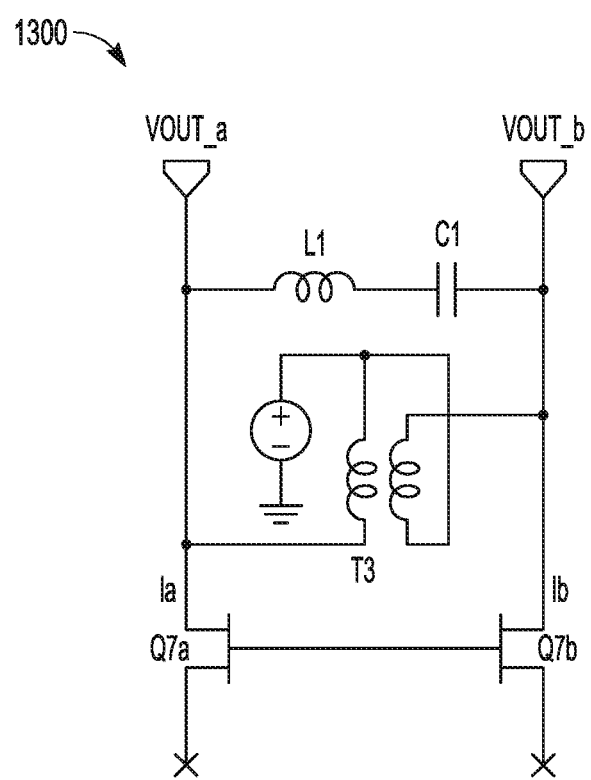
FIG. 13 shows an example of a cascode output stage portion of an amplifier circuit, such as in which a balun can short out even-order currents.

FIG. 13 shows an example of a cascode output stage 1300 portion of an amplifier circuit, such as in which a balun T3 can be connected such that even-order currents within Ia and Ib will short out, rendering the outputs Vout_a and Vout_b free of second order distortions. In practice, balance may not have sufficient bandwidth to provide sufficient levels of cancellation. In such cases, a low pass filter, such as formed by L1 and C1 in series with each other, with such series placed across Vout_a and Vout_b. This can provide a supplemental lowpass notch formed by L1 and C1, which can help short out second order harmonics for the upper portion of the frequency band for which balun second-order attenuation performance is insufficient. Bias current may also be brought in through the balun T3. It can be noted that the direction of bias current within the balun T3 results in magnetic flux cancellation, which prevents the magnetic material from saturating.

Figure 14:
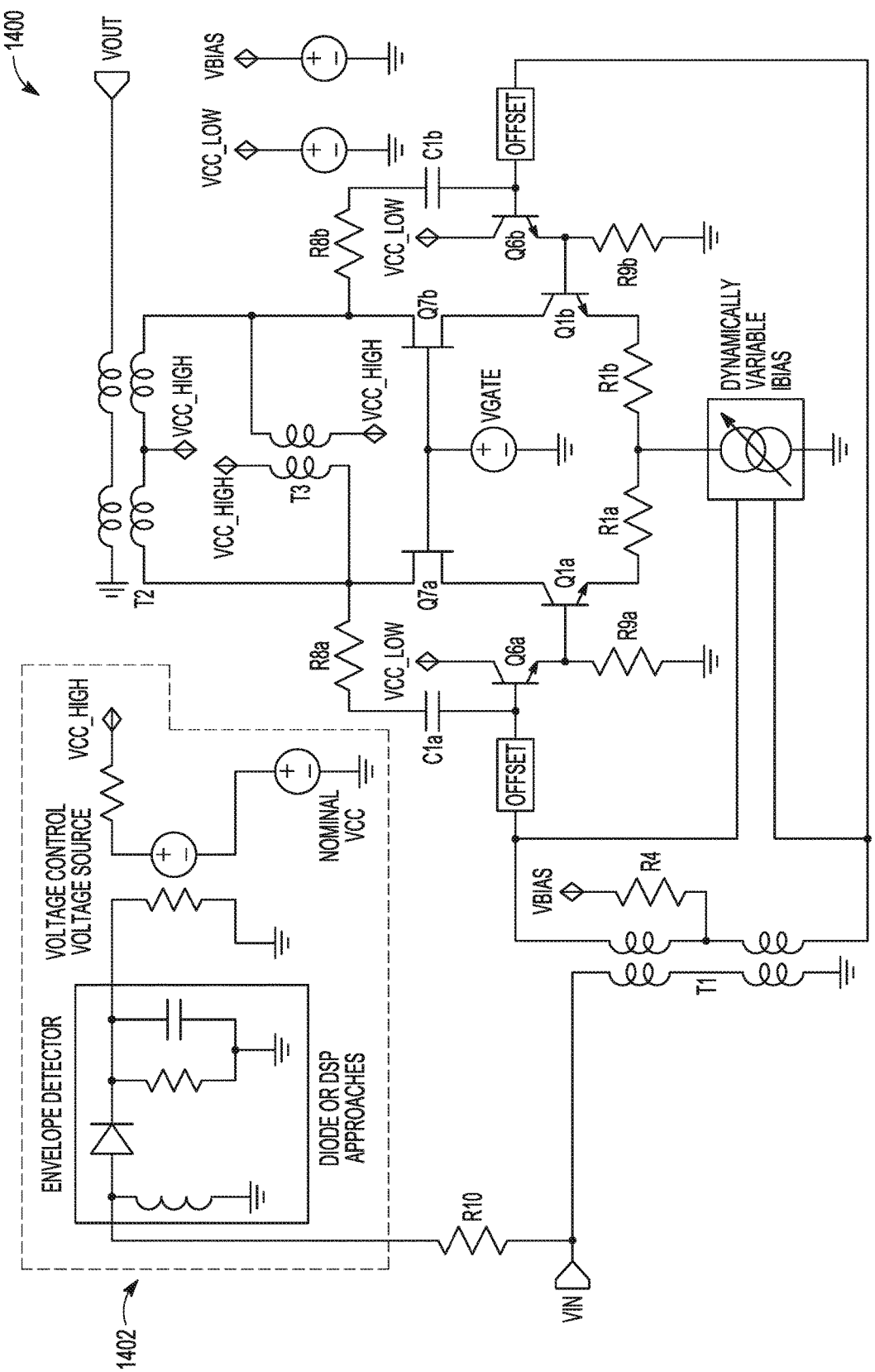
FIG. 14 shows an example of an amplifier circuit 1400 in which an envelope tracking circuit can be additionally included, such as to modulate a magnitude of supply voltage VCC.

FIG. 14 shows an example of an amplifier circuit 1400 in which an envelope tracking circuit 1402 can be additionally included, such as can additionally modulate a magnitude of supply voltage VCC used by the amplifier circuit 1400, with such envelope being an indirect function of the input signal, Vin, which does not include all the high frequency content of Vin.

In the example shown in FIG. 14, the bias current can be dynamically adjusted as a direct function of the input signal, Vin, albeit with level-shifting, buffering, or delay, as explained earlier, such that the bias current modulation can track the high frequency content of the input signal, Vin. Additionally, the envelope tracking circuit 1402 can adjust the supply voltage Vcc that delivers the main bias current, such as to dynamically increase the supply voltage Vcc for higher input signal envelope magnitudes, since it can be difficult to provide a voltage source able to track the full bandwidth of incoming signal. In such a case, it can be useful to determine the envelope of the incoming input signal, Vin, and use that information to adjust the primary supply, shown as VCC_High in FIG. 14. Although the bandwidth of the envelope detector is usually much less than the bandwidth of the input signal itself, adjusting VCC_High at some lesser rate can still provide for a meaningful efficiency enhancement. When the input signal magnitude is large, both the bias current and supply voltage can be increased to provide headroom to avoid compression. In this way, the efficiency improvement from just the dynamically variable bias current can be further improved. The envelope detector circuit 1402 can include a series diode and shunt capacitor, resistor, and inductor components, such as shown in FIG. 14. In a system in which the input signal, Vin, originates in digitized form, digital signal processing (DSP) can implement an envelope detector to provide envelope information for modulating the supply voltage Vcc, such as for helping align timing waveforms to ensure that the change in the supply voltage VCC is in synchronization with the envelope of the input signal Vin.

Although the above description has emphasized an example using a differential pair of transistors with dynamic bias current, the present techniques can also be applied to a single-ended approach, such as can include using a half-circuit of the differential pair, or such as can include biasing an input base terminal of one of the differential pair of transistors at a fixed voltage and coupling the varying input signal to the other of the differential pair of transistors.

A numbered non-limiting list of aspects of the present subject matter is presented below.

Aspect 1 can include or use subject matter (such as an apparatus, a system, a device, a method, a means for performing acts, or a device readable medium including instructions that, when performed by the device, can cause the device to perform acts), such as can include or use a power amplifier circuit such as for broadband data communication such as over a path in a communication network, such as can help maintain low distortion gain performance. The power amplifier circuit can include a differential pair arrangement of first and second transistors, which can respectively be coupled to a common emitter bias node such as via respective first and second resistors. A dynamic variable bias current circuit can be coupled to the common emitter bias node of the differential pair of the first and second transistors, such as to provide a dynamic variable bias current thereto, such as a function of an input signal amplitude of an input signal communicated to differential pair of the first and second transistors.

Aspect 2 can include or use, or can optionally be combined with the subject matter of Aspect 1 to include or use a dynamic variable bias current circuit such as can be configured to increase bias current to the differential pair of the first and second transistors, such as in response to increased input signal amplitude of the input signal.

Aspect 3 can include or use, or can optionally be combined with the subject matter of any of Aspects 1 or 2 such as to include or use the dynamic variable bias current circuit such as can be configured to vary the bias current to the differential pair of the first and second transistors such as with the full frequency spectral content of the input signal (e.g., as opposed to the envelope of the input signal, which does not include the full frequency spectral content of the input signal).

Aspect 4 can include or use, or can optionally be combined with the subject matter of any of Aspects 1 through 3 such as to include or use the dynamic variable bias current circuit such as can be configured to vary the bias current to the differential pair of the first and second transistors such as with the full frequency response of the differential pair of the first and second transistors.

Aspect 5 can include or use, or can optionally be combined with the subject matter of any of Aspects 1 through 4 such as to include or use the dynamic variable bias current circuit such as can be configured to trigger an increase in bias current to the differential pair, such as only when an amplitude of the input signal exceeds a specified threshold voltage.

Aspect 6 can include or use, or can optionally be combined with the subject matter of any of Aspects 1 through 5 such as to include or use the dynamic variable bias current circuit such as can include an offset circuit or level-shifting circuit, such as to establish the specified threshold voltage.

Aspect 7 can include or use, or can optionally be combined with the subject matter of any of Aspects 1 through 6 such as to include or use an envelope tracking circuit such as can be configured to vary a supply voltage of the differential pair of the first and second transistors, such as in response to an envelope of the input signal.

Aspect 8 can include or use, or can optionally be combined with the subject matter of any of Aspects 1 through 7 such as can include or use a delay circuit, such as in a signal path of the input signal, such as between an input to the dynamic variable bias current circuit and an input to the differential pair of the first and second transistors. The delay circuit can help align a phase of the dynamic variable bias current with signal amplification of the input signal by the differential pair of the first and second transistors, such as by providing a delay in the signal path to the differential pair of the first and second transistors.

Aspect 9 can include or use, or can optionally be combined with the subject matter of any of Aspects 1 through 8 such as can include or use an input transformer, such as coupling the input signal for communication to inputs of the differential pair of the first and second transistors.

Aspect 10 can include or use, or can optionally be combined with the subject matter of any of Aspects 1 through 9 such as can include or use first and second cascode transistors, such as can be coupled to receive respective output currents of the differential pair of the first and second transistors.

Aspect 11 can include or use, or can optionally be combined with the subject matter of any of Aspects 1 through 10 such as can include or use an output transformer, such as can be coupled to the respective collector terminals of the differential pair of the first and second transistors (e.g., optionally via respective cascode transistors) such as to convert output currents of the differential pair of the first and second transistors into an output voltage.

Aspect 12 can include or use, or can optionally be combined with the subject matter of any of Aspects 1 through 11 such as can include or use a balun, such as can be coupled to the respective collector terminals of the differential pair of the first and second transistors (e.g., optionally via respective cascode transistors) such as to help cancel an even-order distortion product.

Aspect 13 can include or use, or can optionally be combined with the subject matter of any of Aspects 1 through 12 such as can include or use a passive LC lowpass filter, such as can be coupled to the respective collector terminals of the differential pair of the first and second transistors (e.g., optionally via respective cascode transistors) such as to lowpass filter a higher-than-fundamental frequency harmonic.

Aspect 14 can include or use, or can optionally be combined with the subject matter of any of Aspects 1 through 13 such as can include or use a dynamic variable bias current circuit. The dynamic variable bias current circuit can include first and second bias current transistors, such as each coupled to the common emitter bias node of the differential pair of the first and second transistors, such as with respective inputs of the first and second bias current transistors controlled differentially by the input signal. First and second biasing resistors can be respectively coupled to a corresponding one of the first and second bias current transistors.

Aspect 15 can include or use, or can optionally be combined with the subject matter of any of Aspects 1 through 14 such as can include or use a power amplifier circuit, such as can comprise a differential pair arrangement of first and second transistors, such as respectively coupled to a common emitter bias node such as via respective first and second resistors. The power amplifier circuit can include means for dynamically varying bias current to the differential pair of the first and second transistors based upon an input signal amplitude of an input signal communicated to differential pair of the first and second transistors. For example, such means for dynamically varying bias current can include one or more transistors driven as a function of the input signal, such as with a current limiting resistor in series therewith, and can include one or more of an offset or level-shifting circuit, a delay circuit, a buffer or amplifier circuit (such as can be separate from or shared with the amplifying differential pair of transistors).

Aspect 16 can include or use, or can optionally be combined with the subject matter of any of Aspects 1 through 15 such as can include or use a means for dynamically varying bias current that can be configured to increase the bias current to the differential pair of the first and second transistors only when an amplitude of the input signal exceeds a specified threshold voltage.

Aspect 17 can include or use, or can optionally be combined with the subject matter of any of Aspects 1 through 16 such as can include or use a method of power amplification such as for broadband data communication such as over a path in a communication network, such as can help maintain low distortion performance. The method can include receiving an input signal. The input signal can be communicated differentially such as to first and second inputs of a differential amplifier circuit. A bias current provided to the differential amplifier can be varied, such as a function of the input signal, such as to increase the bias current to the differential amplifier circuit, such as in response to an input signal magnitude.

Aspect 18 can include or use, or can optionally be combined with the subject matter of any of Aspects 1 through 17 such as can include or use varying the bias current, such as can include varying the bias current provided to the differential amplifier circuit as a function of the input signal such as to increase the bias current to the differential amplifier circuit such as when an amplitude of the input signal exceeds a specified threshold value.

Aspect 19 can include or use, or can optionally be combined with the subject matter of any of Aspects 1 through 18 such as can include or use providing a delay in a signal path of the input signal to the differential amplifier circuit, such as to phase align a varying of the bias current signal to amplification of the input signal by the differential amplifier circuit.

Aspect 20 can include or use, or can optionally be combined with the subject matter of any of Aspects 1 through 19 such as can include or use tracking an envelope of the input signal. A supply voltage provided to one or more portions of the amplifier (e.g., such as to a differential pair of transistors performing signal amplification) can be adjusted using the envelope of the input signal.

Aspect 21 can include or use, or can optionally be combined with the subject matter of any of Aspects 1 through 20 such as can include or use attenuating an even order distortion product of an amplification of the input signal.

The above description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A power amplifier circuit for broadband data communication over a path in a communication network while maintaining low distortion gain performance, the power amplifier circuit comprising:
    a differential pair arrangement of first and second transistors, respectively coupled to a common emitter bias node via respective first and second resistors;
    a dynamic variable bias current circuit, coupled to the common emitter bias node of the differential pair to provide a dynamic variable bias current thereto controlled by the input signal communicated to differential pair of the first and second transistors to allow the dynamically variable bias current to vary at the frequency of the input signal.

2. The power amplifier circuit of claim 1, wherein the dynamic variable bias current circuit is configured to increase bias current to the differential pair of the first and second transistors in response to increased input signal amplitude of the input signal.

3. The power amplifier circuit of claim 2, wherein the dynamic variable bias current circuit is configured to vary the bias current to the differential pair of the first and second transistors with the full frequency spectral content of the input signal.

4. The power amplifier circuit of claim 3, wherein the dynamic variable bias current circuit is configured to vary the bias current to the differential pair of the first and second transistors with the full frequency response of the differential pair of the first and second transistors.

5. The power amplifier circuit of claim 2, wherein the dynamic variable bias current circuit is configured to trigger an increase in bias current to the differential pair only when an amplitude of the input signal exceeds a specified threshold voltage.

6. The power amplifier of claim 5, wherein the dynamic variable bias current circuit includes an offset circuit or level-shifting circuit to establish the specified threshold voltage.

7. The power amplifier of claim 1, further comprising an envelope tracking circuit configured to vary a supply voltage of the differential pair of the first and second transistors in response to an envelope of the input signal.

8. The power amplifier of claim 1, further comprising a delay circuit in a signal path of the input signal between dynamic variable bias current circuit and the differential pair, to align a phase of the dynamic variable bias current with signal amplification of the input signal by the differential pair of the first and second transistors by providing a delay in the signal path to the differential pair of the first and second transistors.

9. The power amplifier of claim 1, further comprising an input transformer coupling the input signal for communication to inputs of the differential pair of the first and second transistors.

10. The power amplifier of claim 1, further comprising first and second cascode transistors coupled to receive respective output currents of the differential pair of the first and second transistors.

11. The power amplifier of claim 1, further comprising an output transformer, coupled to the respective collector terminals of the differential pair of the first and second transistors to convert output currents of the differential pair of the first and second transistors into an output voltage.

12. The power amplifier of claim 10, further comprising a balun, coupled to the respective collector terminals of the differential pair of the first and second transistors to cancel an even order distortion product.

13. The power amplifier of claim 10, further comprising a passive LC lowpass filter coupled to the respective collector terminals of the differential pair of the first and second transistors to lowpass filter a higher-than-fundamental frequency harmonic.

14. The power amplifier of claim 1, wherein the dynamic variable bias current circuit includes:
    first and second bias current transistors, each coupled to the common emitter bias node of the differential pair of the first and second transistors, with respective inputs controlled differentially by the input signal; and
    first and second biasing resistors, respectively coupled to a corresponding one of the first and second bias current transistors.

15. A power amplifier circuit comprising:
    a differential pair arrangement of first and second transistors, respectively coupled to a common emitter bias node via respective first and second resistors;
    means for dynamically varying bias current to the differential pair of the first and second transistors, tracking the frequency of the input signal, based upon an input signal amplitude of an input signal communicated to differential pair of the first and second transistors.

16. The power amplifier circuit of claim 15, wherein means for dynamically varying bias current is configured to increase the bias current to the differential pair of the first and second transistors only when an amplitude of the input signal exceeds a specified threshold voltage.

17. A method of power amplification for broadband data communication over a path in a communication network while maintaining low distortion performance, the method comprising:
    receiving an input signal;
    communicating the input signal differentially to first and second inputs of a differential amplifier circuit; and
    varying a bias current, tracking the frequency of the input signal, provided to the differential amplifier circuit as a function of the input signal to increase the bias current to the differential amplifier circuit.

18. The method of claim 17, wherein varying the bias current comprises varying the bias current provided to the differential amplifier circuit as a function of the input signal to increase the bias current to the differential amplifier circuit when an amplitude of the input signal exceeds a specified threshold value.

19. The method of claim 17, comprising:
providing a delay in a signal path of the input signal to the differential amplifier circuit to phase align a varying of the bias current signal to amplification of the input signal by the differential amplifier circuit.

20. The method of claim 17 comprising:
tracking an envelope of the input signal; and
adjusting a supply voltage using the envelope of the input signal.

21. The method of claim 17 comprising:
attenuating an even order distortion product of an amplification of the input signal.

22. A power amplifier circuit for broadband data communication over a path in a communication network while maintaining low distortion gain performance, the power amplifier circuit comprising:

a differential pair arrangement of first and second transistors, respectively coupled to a common emitter bias node via respective first and second resistors;
a dynamic variable bias current circuit, coupled to the common emitter bias node of the differential pair to provide a dynamic variable bias current thereto as a function of an input signal amplitude of an input signal communicated to differential pair of the first and second transistors, wherein the dynamic variable bias current circuit includes:
first and second bias current transistors, each coupled to the common emitter bias node of the differential pair of the first and second transistors, with respective inputs controlled differentially by the input signal; and
first and second biasing resistors, respectively coupled to a corresponding one of the first and second bias current transistors.

23. The power amplifier circuit of claim 22, wherein the power amplifier circuit is configured to vary the dynamic bias current, tracking the frequency of the input signal, to dynamically boost an output signal swing of the power amplifier circuit.

* * * * *